(12) United States Patent
Daley

(10) Patent No.: US 10,249,769 B1
(45) Date of Patent: Apr. 2, 2019

(54) ON-CHIP TUNEABLE DIFFUSION RESISTOR

(71) Applicant: Dialog Semiconductor Inc., Campbell, CA (US)

(72) Inventor: Douglas Daley, Idaho Falls, ID (US)

(73) Assignee: Dialog Semiconductor, Inc., Campbell, CA (US)

( * ) Notice: Subject to any disclaimer, the term of this patent is extended or adjusted under 35 U.S.C. 154(b) by 0 days.

(21) Appl. No.: 15/839,898

(22) Filed: Dec. 13, 2017

(51) Int. Cl.
| | |
|---|---|
| *H03L 5/00* | (2006.01) |
| *H01L 29/8605* | (2006.01) |
| *H01L 29/06* | (2006.01) |
| *H01L 27/06* | (2006.01) |
| *H03H 9/00* | (2006.01) |
| *H01L 29/78* | (2006.01) |

(52) U.S. Cl.
CPC ...... *H01L 29/8605* (2013.01); *H01L 27/0629* (2013.01); *H01L 29/0684* (2013.01); *H01L 29/785* (2013.01); *H03H 9/0004* (2013.01)

(58) Field of Classification Search
CPC ......... H01L 2924/00; H01L 2924/0002; G11C 2213/72
See application file for complete search history.

(56) References Cited

U.S. PATENT DOCUMENTS

| | | | |
|---|---|---|---|
| 2004/0070050 A1 | 4/2004 | Chi | |
| 2006/0097349 A1* | 5/2006 | Shaw | H01L 28/20 257/536 |
| 2008/0093659 A1* | 4/2008 | Voegeli | H01L 27/0635 257/324 |
| 2008/0117653 A1 | 5/2008 | Saito | |
| 2012/0175749 A1* | 7/2012 | Haensch | H01L 21/845 257/623 |
| 2012/0313692 A1* | 12/2012 | Sutardja | H01L 27/0794 327/535 |
| 2014/0049356 A1* | 2/2014 | Dicke | H01C 10/50 338/13 |
| 2017/0069616 A1* | 3/2017 | Cai | H01L 27/0255 |

FOREIGN PATENT DOCUMENTS

EP 2 456 152 5/2012

* cited by examiner

*Primary Examiner* — Sibin Chen
(74) *Attorney, Agent, or Firm* — Saile Ackerman LLC; Stephen B. Ackerman

(57) ABSTRACT

An object of the disclosure is to take a CMOS varactor structure (NMOS in N-well or PMOS in P-well) and turn it in to a three terminal on-chip tuneable diffusion resistor. The diffusion resistor can be made with an n+ diffusion inside the p-substrate, or with a p+ diffusion inside an N-well that lies within the p-substrate. The resistor can be implemented in any existing CMOS or BICMOS silicon technology, without using additional masks. The resistor can be also implemented in a technology with FINFETs.

19 Claims, 4 Drawing Sheets

ON-CHIP TUNEABLE DIFFUSION RESISTOR

BACKGROUND

Field

The disclosure relates generally to semiconductor devices, and in particular to tuneable diffusion resistors.

Description

Current resistors in silicon technologies do not have adjustable resistance that can be controlled by the user. The device is built and may vary due to process or mismatch variation. Neither of these can be controlled, and require design to account for these changes in value by guardbanding the design.

SUMMARY

An object of the disclosure is to provide an on-chip tuneable diffusion resistor, having a resistance, which can be adjusted during circuit operation.

A further object of the disclosure is to minimize mismatch and process variation in current mirrors, voltage dividers, ADC, and DACs, for example.

Another object of the disclosure is to take advantage of the benefit of being constructed with existing layers found in existing semiconductor foundry offerings, reducing development cost.

In addition, an object of the disclosure is to provide a voltage-controlled resistor.

A further object of the disclosure is to eliminate trim bias and test time during the manufacturing process.

To accomplish the above and other objects, an on-chip tuneable diffusion resistor is disclosed, comprising a metal or polysilicon layer deposited on top of an insulating layer (oxide or other), comprising a diffusion well implanted beneath this in the silicon substrate. Two implant regions define a first terminal and a second terminal in the diffusion well, connected independently. A voltage difference is applied to the first and second terminals, and current flows through the diffusion well, determining the total amount of current flowing. A depletion region is established beneath the insulating layer, by the voltage applied to the conduction layer above the insulator, and the effective thickness of the resistor is reduced. With the effective thickness of the resistor reduced, the resistance is increased. The amount of the change in the resistance is configured to depend on the ratio of the depth of the depletion region, to the depth of the diffusion well underneath.

The above and other objects are further achieved by a method of using an on-chip tuneable diffusion resistor. The steps include providing a metal or polysilicon layer deposited on top of an insulating layer, comprising a diffusion well implanted beneath the insulating layer, in a silicon substrate. The steps also include providing two implant regions, defining a first terminal and a second terminal in the diffusion well, connected independently. The steps also include applying a voltage difference to the first and second terminals, causing current to flow through the diffusion well, providing a resistance. The steps also include creating a depletion region beneath the insulating layer, reducing an effective thickness of a resistor, increasing the resistance.

In various embodiments the function may be achieved using existing CMOS or BICMOS silicon technology.

In various embodiments the function may be achieved using FINFET technology.

In various embodiments the function may be achieved using N+ terminals and an N-well, sitting on a p-substrate.

In various embodiments the function may be achieved using P+ terminals and a P-well implant, in an N-well sitting on a p-substrate.

DETAILED DESCRIPTION

While diffusion resistors and MOS varactors are known in the prior art, a novel structure using both as a basis is described herein. The primary objective of the disclosure is to build a resistor with a value that can be adjusted during circuit operation. This allows integrated circuit designers to place resistors in a standard match structure, and use a feedback loop to alter the resistance of each individual resistor to improve matching, potentially reducing it to zero. The device can also be used to create a fixed resistance independent of both mismatch and process variation, through the same feedback loop. This would depend on the range of adjustment the resistor provides.

The present disclosure can use a CMOS process, and a feature is the ability to connect to both sides of a diffusion, while using a gate structure above it to modulate the depletion region under the gate, thereby altering the effective thickness of the diffusion and resistance of the device.

The present disclosure consists of a metal or polysilicon layer deposited on top of an insulating layer (oxide or other), with a diffusion implanted beneath this in the silicon substrate. The embodiment can be made with an n+ diffusion inside the p+ substrate, or with a p+ diffusion inside an n-well that lies within the p-substrate. The disclosure can be implemented in any existing CMOS or BICMOS silicon technology not using FINFETs, without using additional masks. The disclosure can be implemented in a technology with FINFETs as well, typically in a semiconductor foundry which provides a MOS varactor in a FINFET technology.

Figure 1:
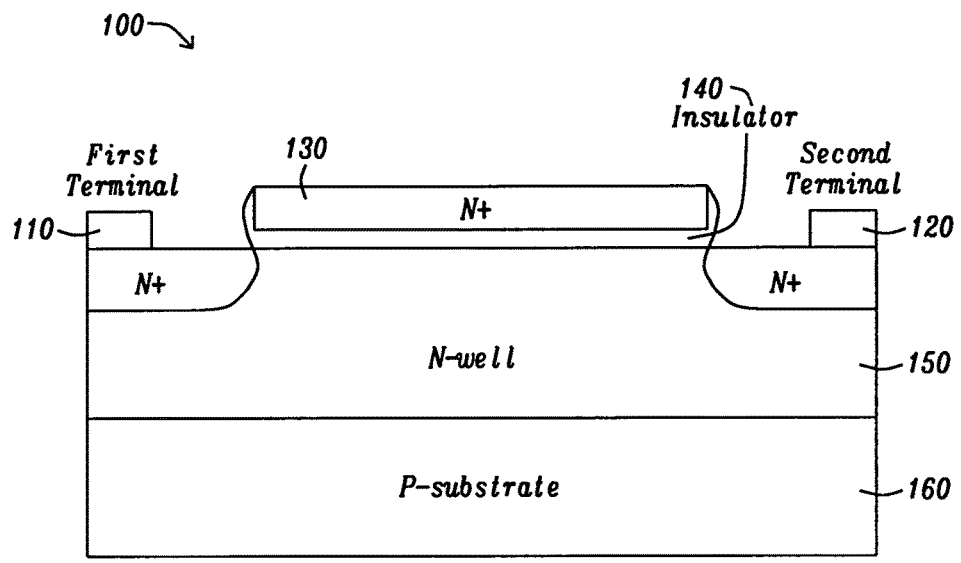
FIG. 1 illustrates a cross section of an on-chip tuneable diffusion resistor, implemented as an n-type device, embodying the principles of the disclosure.

FIG. 1 illustrates cross section 100 of the disclosed on-chip tuneable diffusion resistor, implemented as an n-type device. The presence of N-well 150, an n-diffusion connecting the two N+ implant regions, differentiates this from a standard MOSFET device, where in place of the N-well, p-substrate 160 would be located instead. The cross section is similar to a MOS varactor, but with a different purpose and connections.

In a MOS varactor, both first terminal 110 and second terminal 120 connecting to the N+/N-well 150 are shorted together, and treated as a single plate of a parallel plate capacitor. N+ polysilicon layer 130 above insulator 140 makes the other plate of the capacitor. The capacitance of the device is then defined by the thickness of the insulating layer and by the depth of the depletion region in the N-well beneath, which can be created by applying a voltage to the N+ polysilicon layer above the insulator. This allows for an adjustable capacitance.

In the present disclosure first terminal 110 and second terminal 120 of N-well 150 are connected independently, allowing it to be used as a resistor. When a voltage difference is applied to the first and second terminals, current will flow through the N-well, which being resistive, will determine the total amount of current flowing via Ohm's Law. The depletion region can be employed to alter the thickness of the resistor, rather than altering the capacitance in a MOS varactor structure. As the depletion region is established beneath insulating layer 140, by the voltage applied to conduction layer 130 above the insulator, the effective thickness of the resistor is reduced. With the effective thickness of the resistor reduced, the resistance will increase. The amount of change in the resistance will depend on the ratio of the depth of the depletion region to the depth of the n-well underneath.

Figure 2A:
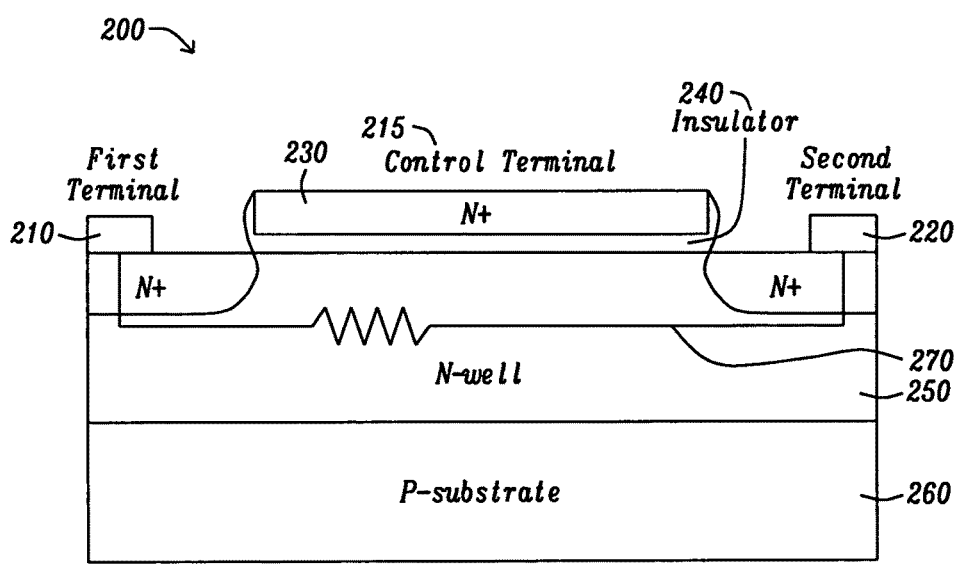
FIG. 2A shows the three terminals of the device, and indicates the resistor location in the N-well, embodying the principles of the disclosure.

FIG. 2A shows the three terminals of disclosed device 200, and indicates the resistor location in the N-well. A gate voltage is applied at control terminal 215, on N+ polysilicon layer 230, and first terminal 210 and second terminal 220 are connected independently. This allows the device it to be used as resistor 270 in N-well 250, with insulator 240 and substrate 260.

The goal of the disclosure is to create a tuneable resistor. For the case of cancelling mismatch in current mirrors, or other circuits where matching resistors are used, the resistor can be tuned by 1-2%. If a greater amount of tuning is available (10-20%) it could also be used to cancel process variation. Due to the deeper diffusion of the resistor, the effects on the resistance from the applied gate voltage are more linear, and allows for a finer tuning of the device.

To provide a numerical example, if a standard 5V depletion mode MOSFET has an ON resistance of 10 ohms and an OFF resistance 10M-ohm, then the 5V applied gate voltage is responsible for the entire range of resistance change. Assuming linearity for ease of calculation (though it wouldn't be perfectly linear), (10M-10)/5V=2M-ohm/V. To tune the resistor to 1 ohm precision, the gate voltage needs to be controlled with 500 nV of accuracy. This would be extremely difficult to do, and require very precise control of the gate voltage. With the present disclosure, on the other hand, a 10 ohm resistor would be affected by 1-2% for a deep diffusion, or 10-20% for a shallower diffusion. This means the total tuning range of the resistor would only be 0.1-0.2 ohms, or 1-2 ohms, depending on the diffusion depth. A 5V gate oxide is still needed to control the resistor, and there is a ratio of 0.2/5V=40 mOhm/V or 2/5V=400 mOhm/V, allowing for much tighter control with less precision required to control the gate voltage.

Figure 2B:
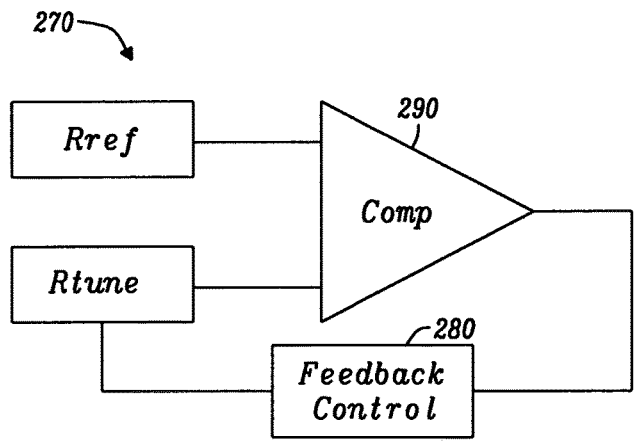
FIG. 2B shows a circuit with a feedback loop, used for tuning the gate voltage and the resistance value, for trimming the resistor or for matching two resistors.

FIG. 2B shows circuit 270 with a feedback loop, used for tuning the gate voltage and the resistance value, for trimming the resistor or for matching two resistors. In either case feedback circuit 280 is used with comparator 290, to compare the current flow through, or the voltage across, the two resistors that need to be tuned. The circuit is designed to adjust one or both accordingly. Rref is the resistor to be matched, and Rtune is the tuneable resistor of the disclosure. The comparator compares the voltage difference between the two resistors, providing an output voltage Vdiff=Vrref−Vrtune. The feedback circuit then increases the voltage on the control terminal of FIG. 2A for the resistor, until Vdiff=0V or a maximum voltage Vmax is reached, thereby avoiding damage to the oxide.

Since the device of the disclosure is based off a MOSFET/MOSVAR, and all MOSFETs are MISFETs, the differences between the device and a depletion mode MOSFET will be addressed, which will simultaneously address the differences between the device and a depletion mode MISFET.

Using the depletion mode device as a resistor is generally done when Vgs=0V, and the shallow channel is then used as the resistance. It is theoretically possible to use a depletion mode MOSFET as a variable resistor, though that is not its primary purpose. Because that is not its primary purpose, small adjustments to the gate voltage can create significant non-linear changes to the resistance of the device, as the depletion mode device approaches pinch-off and turns off.

Figure 3A:
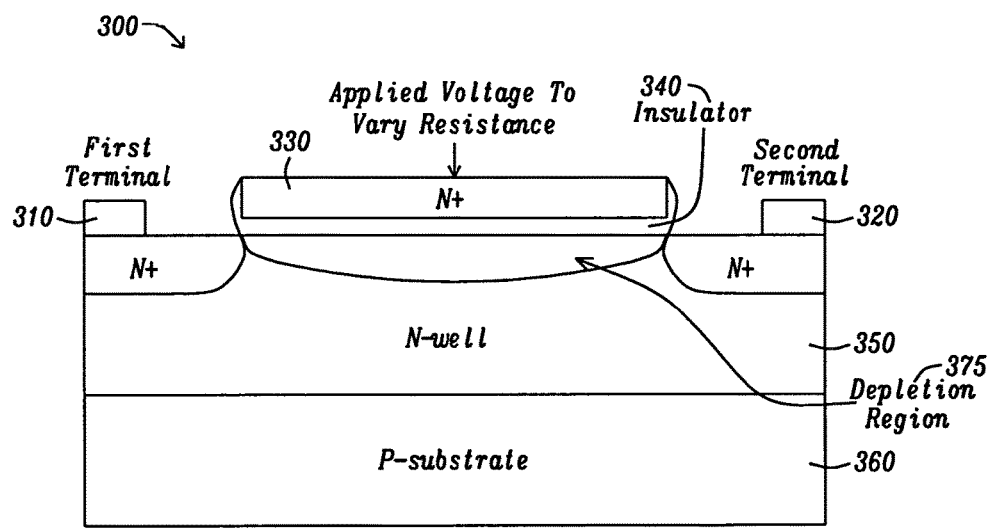
FIG. 3A demonstrates the effect of the depletion region in the structure of the diffusion resistor, of the present disclosure.

FIG. 3A demonstrates the effect of the depletion region in structure 300, of the diffusion resistor of the present disclosure. A conducting channel exists in depletion region 375, created within N-well 350, on substrate 360. This allows the device to conduct when a gate voltage is applied at N+ polysilicon layer 330, above insulator 340. First terminal 310 and second terminal 320 of the N-well are connected independently, allowing the device to be used as a resistor. The diffusion resistor differs from a depletion mode MOSFET, where the device can completely sever a shallower N-well.

The proposed idea specifically does not use a diffusion channel shallow enough to allow the gate to pinch off the diffusion below. This is a key difference with a depletion mode MOSFET or JFET. The deeper diffusions (N-well, n+ diffusion, p+ diffusion, HVNW, etc.) already used in resistors and MOS varactor design, are not pinched off by the field. This also means the processing steps are different than in the creation of a depletion mode MOSFET, since different diffusions must be created below the device. Both the purpose of the present disclosure and method of constructing it in the fab are different from a depletion mode MOSFET.

The applications for the on-chip tuneable diffusion resistor include minimizing mismatch and process variation in current mirrors, voltage dividers, Analog-to-Digital Converters (ADCs), and Digital-to-Analog Converters (DACs), for example. The structure of the proposed resistor has the benefit of being constructed with existing layers found in devices commonly offered by semiconductor foundries, and the resistor is something that could be built in the silicon without requiring much development cost.

One embodiment for making the disclosed device would not require any additional masks, with the default N-well or P-well depth provided by the foundry. If an additional mask is added to the processing steps, the N-well or P-well can become a unique N-well or P-well on the chip, and it's depth can be controlled independently of other N-wells on the chip.

The same embodiment of the present disclosure could be implemented as a p-type structure simply by replacing the N+ and N-well in FIGS. 1, 2A, and 3A with P+ and P-well implants, respectively, and by replacing the p-substrate with N-well, over a p-substrate. This is a standard isolation scheme available in CMOS silicon technologies. The use of the depletion region to control the resistance would be the same in this embodiment, but the resistance of the device would be different as would the depth of the p-well. This embodiment is illustrated in FIG. 3D.

Figure 3B:
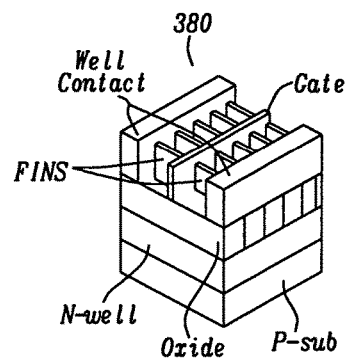
FIG. 3B illustrates a perspective view of an on-chip tuneable diffusion resistor, in FINFET technology, in another embodiment.

FIG. 3B illustrates perspective view 380 of an on-chip tuneable diffusion resistor, in FINFET technology, in another embodiment. Here the N-well, formed on a P-sub substrate, and Well contacts are at separate potentials from one another. The FINs would be what the depletion region would affect, since the Gate is wrapped around them. There is very little effect from the Gate on the underlying N-well, due to the differences in Oxide thicknesses and therefore lowering of the operating voltages. This creates two resistances in parallel, when the Well contacts contact the underlying N-well. One possible implementation is built by severing the N-well connection in the FINFET device. Another variation would include forming the tunable resistor of the disclosure using a planar area.

Figure 3C:
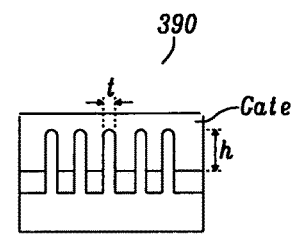
FIG. 3C illustrates a cross-sectional view of a FINFET device, in the embodiment of FIG. 3B.
Figure 3D:
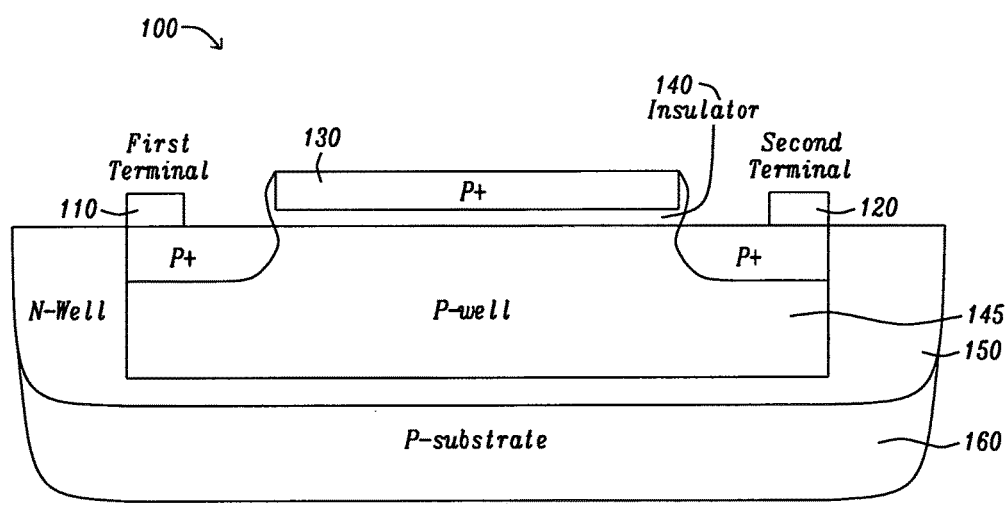
FIG. 3D illustrates another embodiment of the present disclosure, implemented as a p-type structure, using P+ and P-well implants.

FIG. 3C illustrates cross-sectional view 390 of a FINFET device, in the embodiment of FIG. 3B. Multiple FINs would increase capacitance density/area. FIN geometry height h, and thickness t, are fixed process parameters, where device scaling is achieved by varying the FIN length surrounding the Gate.

Figure 4:
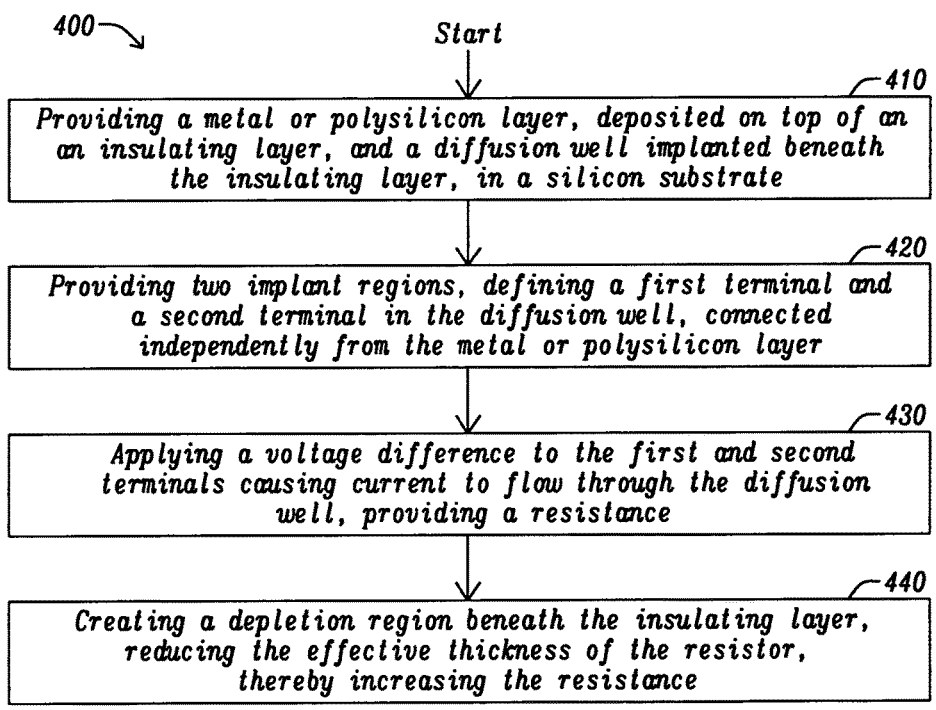
FIG. 4 is a flow chart of a method for using an on-chip tuneable diffusion resistor of the disclosure.

FIG. 4 is flow chart 400 of a method for using an on-chip tuneable diffusion resistor of the disclosure. The above and other objects are further achieved by a method for an on-chip tuneable diffusion resistor. The steps include 410, providing a metal or polysilicon layer deposited on top of an insulating layer, comprising a diffusion well implanted beneath the insulating layer, in a silicon substrate. The steps also include 420, providing two implant regions, defining a first terminal and a second terminal in the diffusion well, connected independently. The steps also include 430, applying a voltage difference to the first and second terminals, causing current to flow through the diffusion well, providing a resistance. The steps also include 440, creating a depletion region beneath the insulating layer, reducing an effective thickness of a resistor, increasing the resistance.

Advantages of one or more embodiments of the present disclosure include any analog design where an adjustable resistance could trim out second order effects. Examples include current mirrors and other devices made with matched pairs of resistors or resistor ladders. The present disclosure would also be applicable to limit temperature coefficients, assuming the tuning range could be controlled to insure that there was sufficient range to cover the change in resistance with temperature. Since the polysilicon gate bias would change the resistance, a simple feedback loop would be all that is required to set the on chip resistors.

While this invention has been particularly shown and described with reference to the preferred embodiments thereof, it will be understood by those skilled in the art that various changes in form and details may be made without departing from the spirit and scope of the invention.

The invention claimed is:

1. An on-chip tuneable diffusion resistor, comprising:
   a metal or polysilicon layer, deposited on top of an insulating layer;
   a diffusion N-well, implanted beneath said insulating layer, in a silicon substrate; and
   two implant regions adjacent to said metal or insulating layer, configured to define a first terminal and a second terminal in said diffusion N-well, and configured to be connected independently from said metal or insulating layer of said on-chip tuneable diffusion resistor.

2. The on-chip tuneable diffusion resistor of claim 1, wherein a depletion region is formed beneath said insulating layer, when a voltage is applied to said metal or polysilicon layer.

3. The on-chip tuneable diffusion resistor of claim 2, wherein said depletion region reduces an effective thickness of said resistor, increasing its resistance.

4. The on-chip tuneable diffusion resistor of claim 3, wherein an amount of change in said resistance depends on a ratio of a depth of said depletion region, to a depth of said diffusion N-well.

5. The on-chip tuneable diffusion resistor of claim 1, wherein said insulating layer is an oxide.

6. The on-chip tuneable diffusion resistor of claim 1, wherein said first and second terminals are N+ terminals and a diffusion well is said N-well diffusion, formed over a p-substrate.

7. An on-chip tuneable diffusion resistor comprising:
   a metal or polysilicon layer, deposited on top of an insulating layer;
   a P-well, implanted beneath said insulating layer, in an N-well on a silicon p-substrate; and
   two P+ implant regions in said P-well, adjacent to said metal or insulating layer, configured to define a first terminal and a second terminal, and configured to be connected independently from said metal or insulating layer.

8. The on-chip tuneable diffusion resistor of claim 1, further comprising adjacent devices, which are CMOS or BICMOS devices.

9. The on-chip tuneable diffusion resistor of claim 1, wherein FINFET technology is used, and two resistances are created in parallel.

10. The on-chip tuneable diffusion resistor of claim 1, further comprising a feedback circuit configured to cancel a mismatch in a circuit where matching resistors comprising the on-chip tuneable diffusion resistor are used.

11. The on-chip tuneable diffusion resistor of claim 10, wherein said feedback circuit is configured to cancel a process variation.

12. The on-chip tuneable diffusion resistor of claim 10, wherein said feedback circuit comprises a comparator configured to compare a current flow through, or a voltage across, the matching resistors.

13. The on-chip tuneable diffusion resistor of claim 12, wherein said feedback circuit is designed to adjust said on-chip tuneable diffusion resistor of said matching resistors, to create a fixed resistance, using a bias applied to said metal or polysilicon layer.

14. A method for using an on-chip tuneable diffusion resistor, comprising:
   providing a metal or polysilicon layer deposited on top of an insulating layer, and a diffusion N-well implanted beneath said insulating layer, in a silicon substrate;
   providing two implant regions, defining a first terminal and a second terminal in said diffusion N-well, connected independently from said metal or polysilicon layer;
   applying a voltage difference to said first and second terminals, causing current to flow through said diffusion N-well, providing a resistance; and
   creating a depletion region beneath said insulating layer, reducing an effective thickness of said on-chip tuneable diffusion resistor, thereby increasing said resistance.

15. The method of claim 14, wherein an amount of change in said resistance depends on a ratio of a depth of said depletion region, to a depth of said diffusion N-well.

16. The method of claim 14, further comprising using a feedback circuit to cancel a mismatch in a circuit using matching resistors comprising the on-chip tuneable diffusion resistor.

17. The method of claim 16, wherein said feedback circuit cancels a process variation.

18. The method of claim 16, further comprising using a comparator to compare a current flow through, or a voltage across, the matching resistors.

19. The resistor of claim 16, wherein said feedback circuit adjusts said on-chip tuneable diffusion resistor of said matching resistors, creating a fixed resistance, using a bias applied to said metal or polysilicon layer.

* * * * *